United States Patent
Mizuno

(10) Patent No.: US 9,899,914 B2
(45) Date of Patent: Feb. 20, 2018

(54) LIGHT SWITCH DEVICE

(71) Applicant: Panasonic Intellectual Property Management Co., Ltd., Osaka (JP)

(72) Inventor: Jun Mizuno, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/327,502

(22) PCT Filed: Sep. 25, 2015

(86) PCT No.: PCT/JP2015/004867
§ 371 (c)(1),
(2) Date: Jan. 19, 2017

(87) PCT Pub. No.: WO2016/051739
PCT Pub. Date: Apr. 7, 2016

(65) Prior Publication Data
US 2017/0170727 A1 Jun. 15, 2017

(30) Foreign Application Priority Data
Sep. 30, 2014 (JP) .................................. 2014-201696

(51) Int. Cl.
*H05B 37/02* (2006.01)
*H02M 3/156* (2006.01)
*H05B 33/08* (2006.01)

(52) U.S. Cl.
CPC ........ *H02M 3/156* (2013.01); *H05B 33/0815* (2013.01)

(58) Field of Classification Search
CPC ............................ H02M 3/156; H05B 33/0815
(Continued)

(56) References Cited

U.S. PATENT DOCUMENTS 7,928,670 B2 * 4/2011 Chen .................. H05B 33/0815
315/159
9,288,854 B2 * 3/2016 Choi .................. H05B 33/0815
(Continued)

FOREIGN PATENT DOCUMENTS

JP 2012-138279 7/2012
JP 2012-190559 10/2012
(Continued)

OTHER PUBLICATIONS

International Search Report of PCT application No. PCT/JP2015/004867 dated Dec. 8, 2015.

*Primary Examiner* — Daniel D Chang
(74) *Attorney, Agent, or Firm* — McDermott Will & Emery LLP

(57) ABSTRACT

A lighting device includes a DC/DC converter, a drive circuit, and a delay circuit. The drive circuit generates a feedback signal and a PWM signal. The feedback signal indicates whether or not a voltage required for a constant current to flow in a solid-state light emitting device is applied to the solid-state light emitting device. The PWM signal indicates a current supply period during which a current flows in the solid-state light emitting device. The delay circuit delays at least one of a start timing and an end timing of the current supply period with respect to the PWM signal. The DC/DC converter includes: a switching element, and a control circuit which performs control such that the switching element switches in accordance with the feedback signal generated by the drive circuit, during an on-duty period determined by the PWM signal the timing of which has been delayed by the delay circuit.

7 Claims, 10 Drawing Sheets

(58) Field of Classification Search
USPC .......................................................... 315/53
See application file for complete search history.

(56) References Cited

U.S. PATENT DOCUMENTS

| | | |
|---|---|---|
| 2012/0161640 A1 | 6/2012 | Kimura |
| 2012/0229045 A1 | 9/2012 | Kikuchi et al. |
| 2012/0242246 A1 | 9/2012 | Naruo |
| 2012/0243272 A1 | 9/2012 | Shimada et al. |

FOREIGN PATENT DOCUMENTS

| | | |
|---|---|---|
| JP | 2012-190959 | 10/2012 |
| JP | 2012-200118 | 10/2012 |
| JP | 2012-204360 | 10/2012 |

* cited by examiner

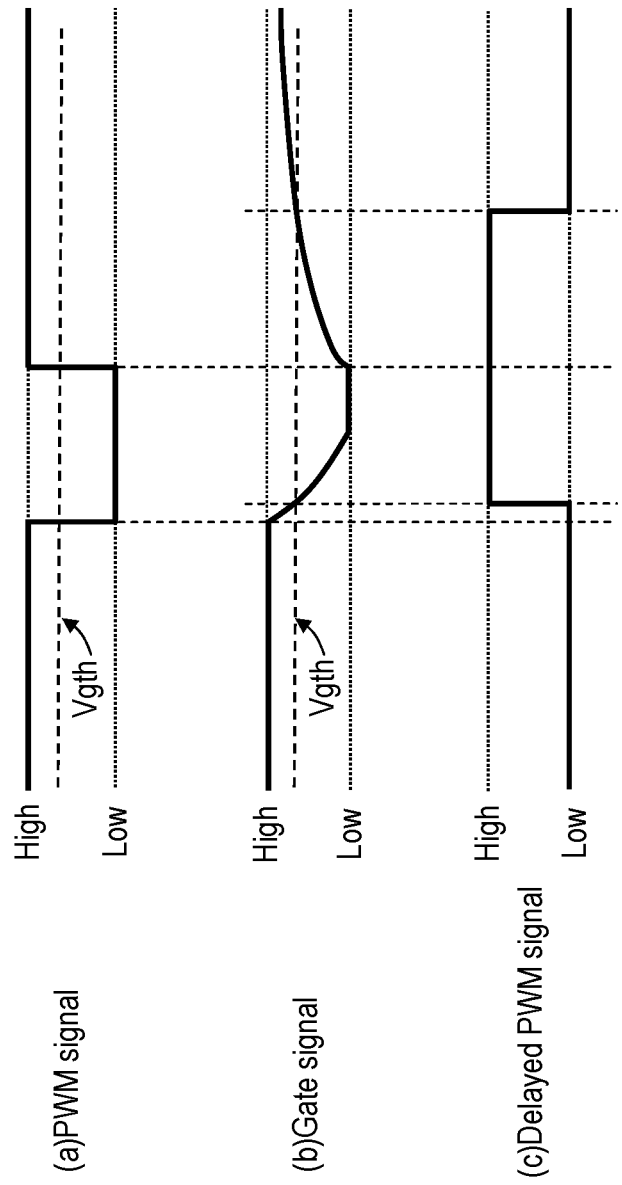

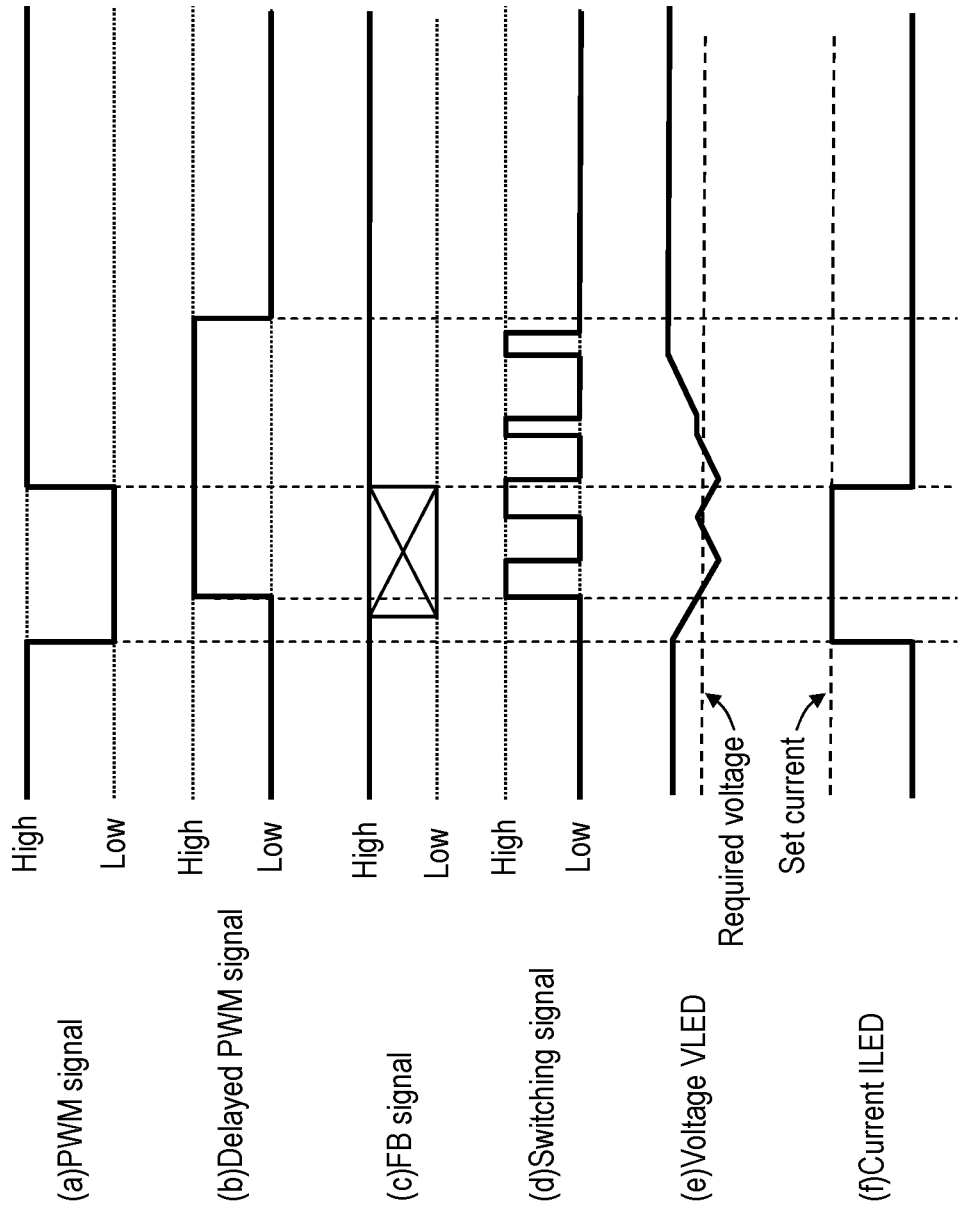

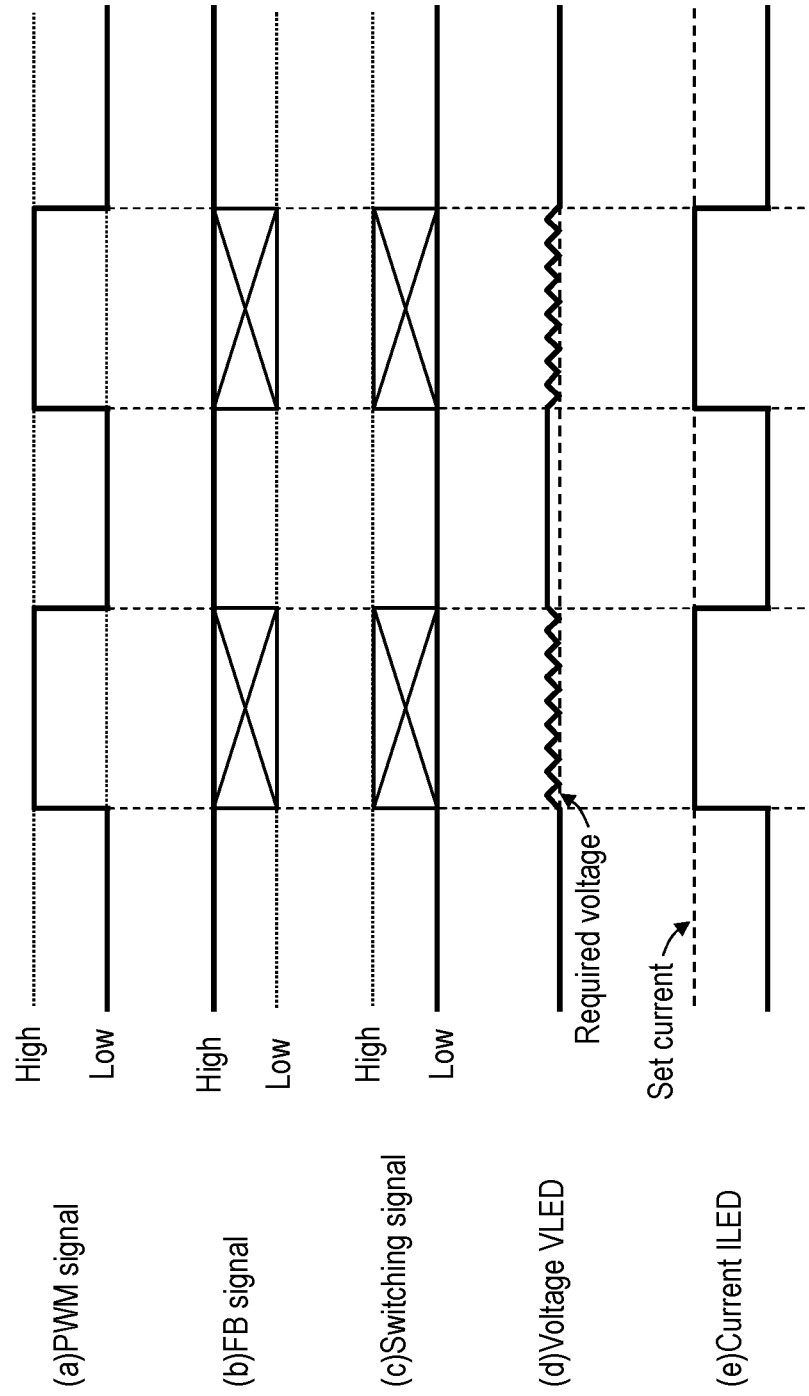

LIGHT SWITCH DEVICE

TECHNICAL FIELD

The present disclosure relates to lighting devices for supplying constant electric currents to solid-state light emitting devices.

BACKGROUND ART

Patent Literature 1 discloses a lighting device for supplying a constant electric current to a solid-state light emitting device such as a light emitting diode (LED). Various types of lighting devices having a dimming function have been proposed. The lighting device disclosed in Patent Literature 1 is capable of performing the dimming function via pulse width modulation (PWM) control through use of a direct current/direct current (DC/DC) converter.

Unfortunately, the lighting device disclosed in Patent Literature 1 has posed a problem of the PWM control. The problem is such that the lowest gradation value is relatively large which is displayed in accordance with an on-duty capable of maintaining the constant current operation (the lowest gradation value is luminance displayed in accordance with the on-duty that is the minimum one larger than zero). Note that the on-duty is a ratio of the duration of an operating state to the duration of a non-operating state. For the lighting device the luminance of which is controlled via the PWM control, the luminance decreases with decreasing on-duty.

For example, with the lighting device according to Patent Literature 1, the lowest gradation value is about 1% in accordance with the on-duty that can maintain the constant current operation in the PWM control. Accordingly, a very low on-duty of e.g. 0.2% is difficult to achieve. For this reason, in cases where the lighting device is used as a backlight of a liquid crystal display device, for example, an expression at such very low luminance is difficult to display.

CITATION LIST

Patent Literature

PTL 1: Japanese Patent Unexamined Publication No. 2012-204360

SUMMARY

The present disclosure is intended to provide a lighting device capable of lighting a solid-state light emitting device at lower luminance than before.

The lighting device according to the present disclosure is a lighting device that can supply a constant electric current to the solid-state light emitting device. The lighting device includes: a drive circuit; a delay circuit; and a DC/DC converter that generates, from a direct-current voltage, another direct-current voltage to be applied to the solid-state light emitting device. The drive circuit generates a feedback signal and a pulse width modulation (PWM) signal. The feedback signal indicates whether or not a voltage required for a constant current to flow in the solid-state light emitting device is applied to the solid-state light emitting device. The PWM signal indicates a current supply period during which a current is caused to flow in the solid-state light emitting device. The delay circuit delays at least one of the start timing and the end timing of the current supply period with respect to the PWM signal generated by the drive circuit.

The DC/DC converter includes a switching element and a control circuit. The control circuit performs control such that the switching element is caused to switch in accordance with the feedback signal generated by the drive circuit, during an on-duty period determined by the PWM signal the timing of which has been delayed by the delay circuit.

The lighting device according to the present disclosure is capable of lighting the solid-state light emitting device at lower luminance than before.

BRIEF DESCRIPTION OF DRAWINGS

FIG. 5 is a timing chart illustrating an example of an operation of the delay circuit which is included in the lighting device according to the first embodiment.

FIG. 6 is a timing chart illustrating an example of an operation of a DC/DC converter which is included in the lighting device according to the first embodiment.

FIG. 7A is a timing chart illustrating a normal operation of the lighting device which supplies a constant electric current to a solid-state light emitting device.

DESCRIPTION OF EMBODIMENTS

Figure 1:
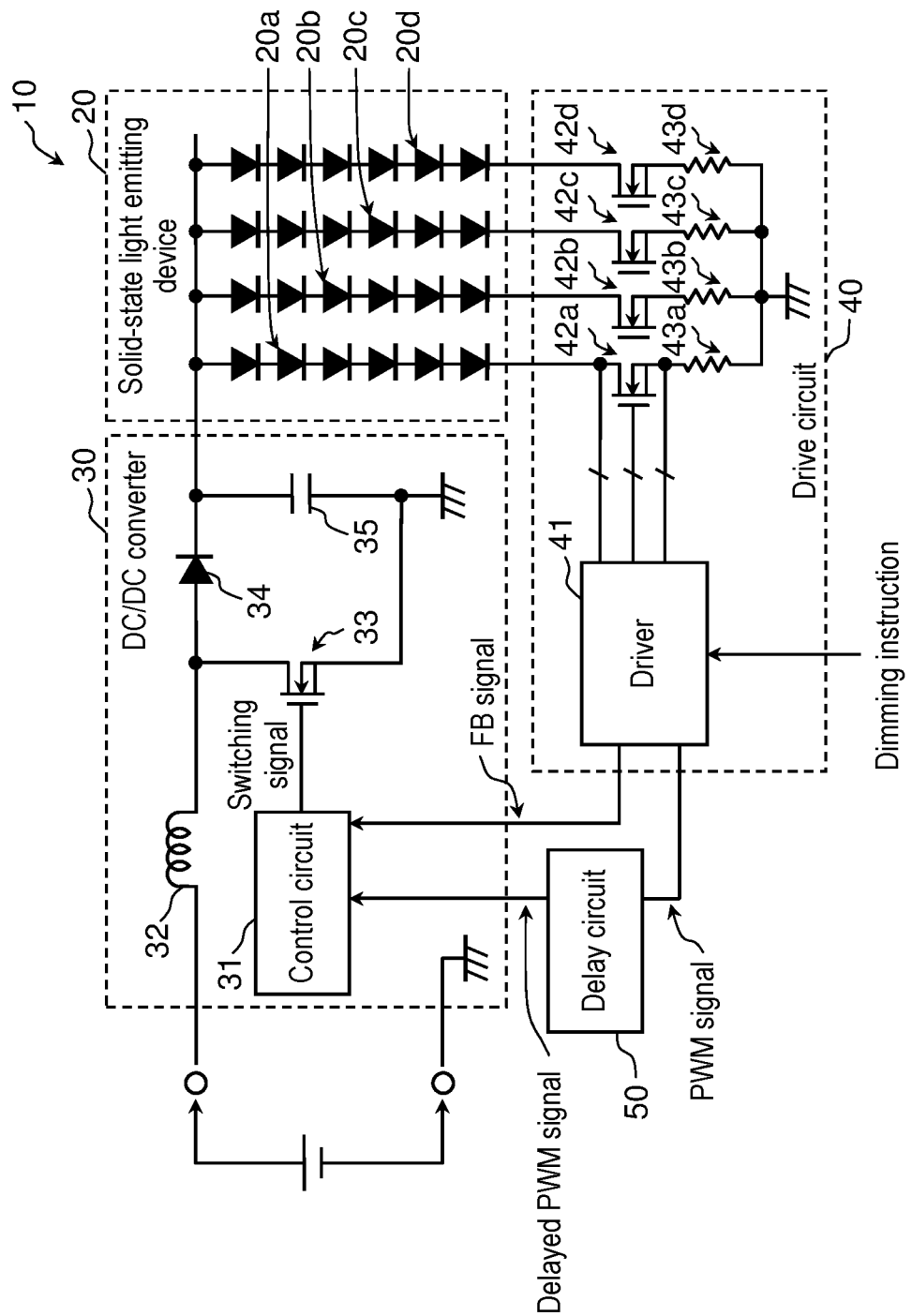
FIG. 1 is a schematic view of an example of a circuit configuration of a lighting device according to a first embodiment.

Underlying Knowledge Forming Basis of the Present Disclosure

Prior to descriptions of embodiments, underlying knowledge that forms the basis of the present disclosure will be described.

FIG. 7A is a timing chart illustrating a normal operation of a lighting device which supplies a constant electric current to a solid-state light emitting device. The solid-state light emitting device is an LED or the like, for example. Moreover, the normal operation is an ideal operation, that is, a required operation.

The lighting device is provided with a chopper-type DC/DC converter (not shown) which has a dimming function via PWM control.

Chart (a) of FIG. 7A shows a PWM signal inputted to the DC/DC converter. The PWM signal is a logic signal that specifies a current supply period, that is, a period during which the solid-state light emitting device is supplied with a current. The PWM signal is generated in accordance with a dimming instruction from the outside, with the signal having a predetermined frequency (e.g., 120 Hz) and a variable on-duty period. Note that the dimming instruction is a signal that instructs a level of dimming. For example, such a signal specifies the on-duty (%) in the PWM control.

Chart (b) of FIG. 7A shows a feedback (referred to as "FB" hereinafter) signal that is inputted to the DC/DC converter. The FB signal is a signal to indicate whether or not a voltage is applied to the solid-state light emitting device, and the FB signal is generated based on the detection of the current flowing in the solid-state light emitting device. Such a voltage (referred also to as "required voltage" hereinafter) is required for a constant current to flow in the solid-state light emitting device. For example, the FB signal is the signal that becomes in an open state (referred also to as "High" hereinafter) when a voltage higher than the required voltage is applied to the solid-state light emitting device, and that becomes equal to a ground potential (referred also to as "Low" hereinafter) when a voltage lower than the required voltage is applied to the solid-state light emitting device. The DC/DC converter performs a chopping operation in accordance with the FB signal.

Chart (c) of FIG. 7A shows a control signal (referred to as "switching signal" hereinafter) to cause a switching element to switch, with the switching element configuring a chopper circuit included in the DC/DC converter. The switching signal is a pulse train having a predetermined frequency (e.g., 100 kHz) which appears in a High period of the PWM signal, as shown in FIG. 7A.

Chart (d) of FIG. 7A shows a voltage (referred to as "voltage VLED" hereinafter) which is an output voltage of the lighting device, that is, a voltage applied to the solid-state light emitting device. Note that, in chart (d) of FIG. 7A, a value of the voltage (i.e., the required voltage) required for the constant current to flow in the solid-state light emitting device is indicated by the dashed line, with the required voltage being shown together with voltage VLED. As shown in FIG. 7A, the control by the DC/DC converter is such that, when voltage VLED is higher than the required voltage, the FB signal becomes in the open state, resulting in a decrease in voltage VLED. In contrast, when voltage VLED is lower than the required voltage, the FB signal becomes equal to the ground potential (Low), resulting in an increase in voltage VLED. As a result of the control in accordance with the FB signal, voltage VLED can be held at the required voltage.

Chart (e) of FIG. 7A shows an output current from the lighting device, that is, a current (referred to as "current ILED" hereinafter) flowing in the solid-state light emitting device. Note that, in chart (e) of FIG. 7A, a value of current (referred to as "set current" hereinafter) which serves as a target for the PWM signal is indicated by the dashed line, with the set current being shown together with current ILED. As shown in FIG. 7A, the control by the DC/DC converter is such that current ILED flows in the same amount as the set current, during a High period of the PWM signal.

Figure 7B:
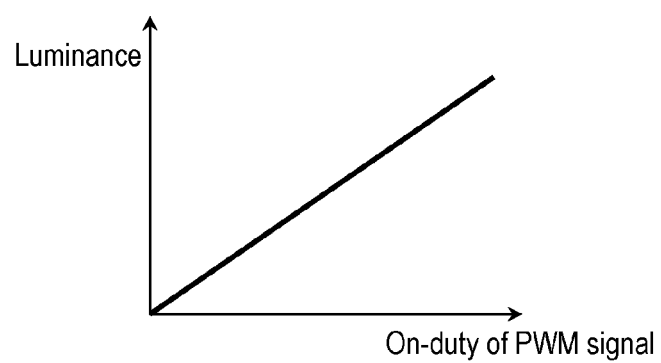
FIG. 7B is a graph that shows dimming characteristics of an ideal lighting device which operates in accordance with the timing shown in FIG. 7A.

FIG. 7B is a graph that shows dimming characteristics of an ideal lighting device which operates in accordance with the timing shown in FIG. 7A. FIG. 7B shows the relation between the on-duty (horizontal axis) of the PWM signal and the luminance (vertical axis) of the solid-state light emitting device.

As can be seen from FIG. 7B, the ideal lighting device exhibits a linear relation (proportional relation) between the on-duty of the PWM signal and the luminance (i.e., the output current of the lighting device) of the solid-state light emitting device; such a linear relation passes through the origin point of the graph. With this relation, the solid-state light emitting device can be lit at any luminance, from the minimum luminance in a shut-off state to the maximum luminance, by changing the on-duty of the PWM signal between 0 (zero) % and 100%, with the PWM signal being fed to the DC/DC converter.

Figure 8A:
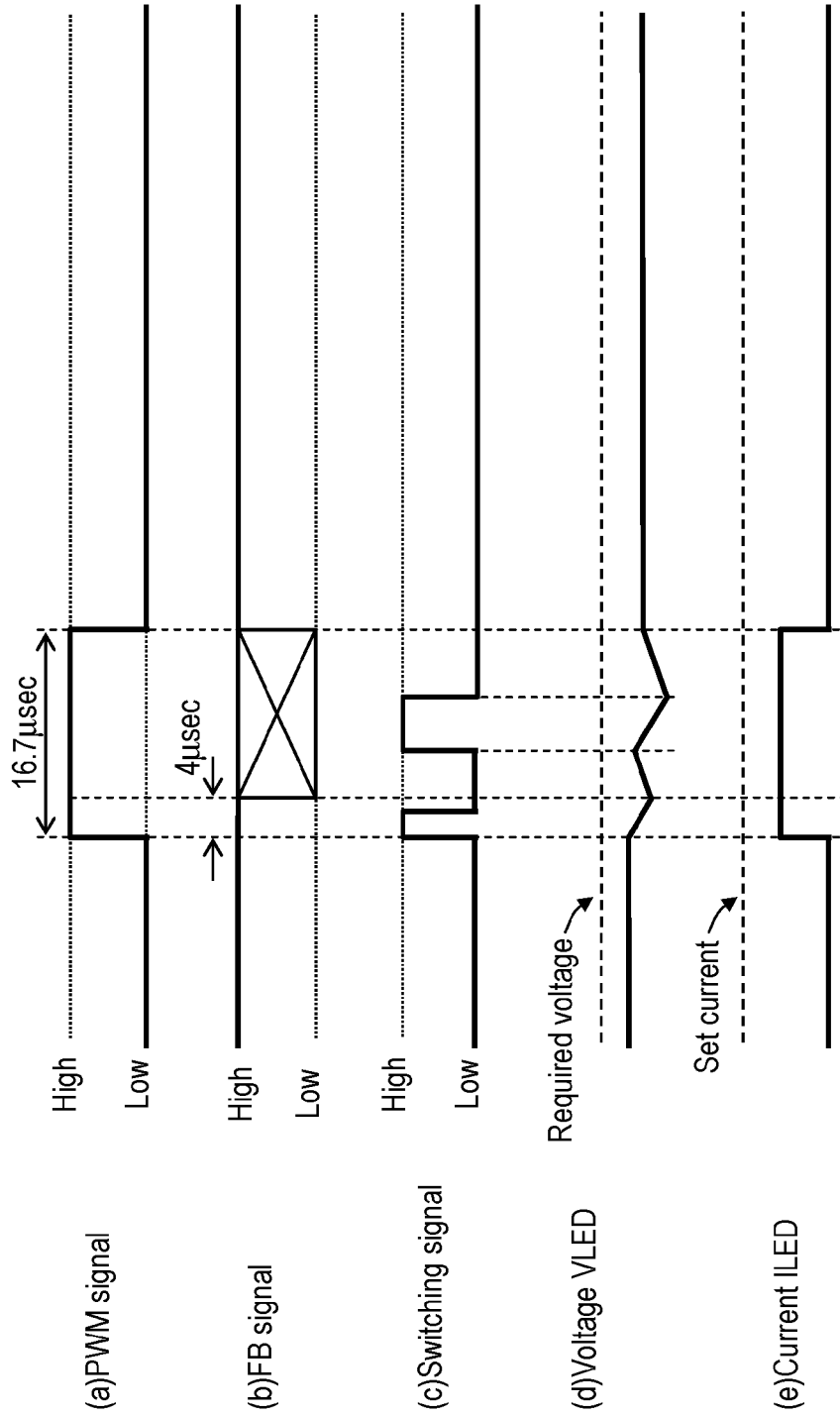
FIG. 8A is a timing chart illustrating an operation of a conventional lighting device.

FIG. 8A is a timing chart illustrating an operation of a conventional lighting device. Such a conventional lighting device is the lighting device described in Patent Literature 1, for example.

Charts (a) to (e) of FIG. 8A correspond to charts (a) to (e) of FIG. 7A; therefore, duplicate descriptions of them will be omitted. The operation shown here is in the case where a PWM signal with a very low on-duty of 0.2% is fed to the DC/DC converter.

Assuming that the frequency of the PWM signal is 120 Hz, for example, then the on-duty of 0.2% is 16.7 μsec (¹⁄₁₂₀×0.2/100). Moreover, assuming that the oscillation frequency of the switching signal is 100 kHz (a cycle of 10 μsec), for example, then two pulse signals (a switching signal in which the number of the oscillations is two) are fed to the switching element during one 0.2% on-duty period of the PWM signal [see charts (a) and (c) of FIG. 8A].

Generally, the FB signal is detected by monitoring the voltage (or current) applied to the solid-state light emitting device; therefore, the FB signal is inputted into the DC/DC converter after a delay from the PWM signal [see chart (b) of FIG. 8A]. FIG. 8A shows a case, as an example, where the FB signal is inputted into the DC/DC converter after a delay of 4 μsec from the timing of starting an on-duty of the PWM signal.

During the delay time from the timing of starting the on-duty of the PWM signal to the time when the FB signal is inputted, the DC/DC converter determines that "the FB signal is in the open state (High)." As a result, the on-duty period of the first pulse signal of the switching signal is shortened, which causes the switching signal to turn into a pulse signal with a shorter on-duty period [see chart (c) of FIG. 8A].

This causes a decrease in voltage VLED applied to the solid-state light emitting device, as shown in chart (d) of FIG. 8A, which causes a state where the voltage VLED is not increased up to the voltage (i.e., the required voltage indicated by the dashed line) required for the constant current to flow in the solid-state light emitting device. Accordingly, as shown in chart (e) of FIG. 8A, current ILED flowing in the solid-state light emitting device becomes in a state (i.e., a state where the constant current operation is not maintained) where the current ILED does not reach the current (i.e., the set current indicated by the dashed line) that serves as the target for the corresponding PWM signal.

Figure 8B:
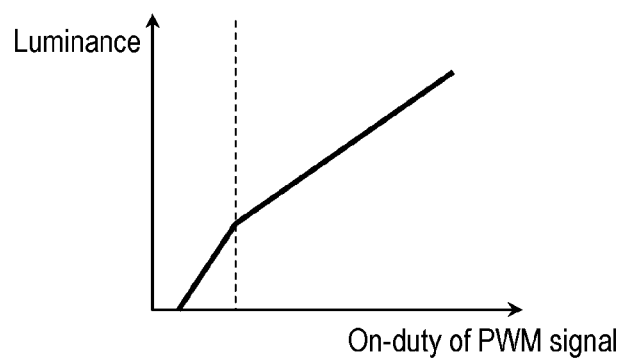
FIG. 8B is a graph that shows dimming characteristics of the conventional lighting device which operates in accordance with the timing shown in FIG. 8A.

For these reasons, dimming characteristics of the conventional lighting device are as shown in FIG. 8B. FIG. 8B is a graph that shows the dimming characteristics of the conventional lighting device which operates in accordance with the timing shown in FIG. 8A. In the same manner as for FIG. 7B, FIG. 8B shows the relation between the on-duty (horizontal axis) of the PWM signal and the luminance (vertical axis) of the solid-state light emitting device.

FIG. 8B depicts a steep-slope straight line and a gentle-slope straight line, with a boundary between them being at the on-duty of a certain PWM signal.

As can be seen from the gentle-slope straight line (the right part of the dimming characteristics) shown in FIG. 8B, when the on-duty of the PWM signal is large to some extent, the number of oscillations (the number of pulses of the pulse signal) of the switching signal during the on-duty period is so large that the influence of the delay of the FB signal is substantially negligible. For this reason, the proportional relation is held between the on-duty of the PWM signal and the luminance of the solid-state light emitting device.

However, as can be seen from the steep-slope straight line (the left part of the dimming characteristics) shown in FIG. 8B, when the on-duty of the PWM signal is small to some extent, the constant current operation cannot be maintained due to the operation shown in FIG. 8A. For this reason, when the on-duty of the PWM signal is reduced, the luminance of the solid-state light emitting device rapidly decreases, which sometimes causes the solid-state light emitting device to lapse into a shut-off state.

In this way, with the conventional lighting device, in cases where the on-duty of the PWM signal is set to be a very low value of e.g. 0.2%, the constant current operation is not maintained. In other words, with the conventional lighting device, the lowest gradation value is relatively large which is displayed in accordance with the on-duty capable of maintaining the constant current operation (the lowest gradation value is the luminance displayed in accordance with the on-duty that is the minimum one larger than zero).

An object of the present disclosure is to provide a lighting device capable of lighting a solid-state light emitting device at lower luminance than before.

Hereinafter, detailed descriptions of embodiments will be made with reference to the accompanying drawings as deemed appropriate. However, descriptions in more detail than necessary will sometimes be omitted. For example, detailed descriptions of well-known items and duplicate descriptions of substantially the same configuration will sometimes be omitted, for the sake of brevity and easy understanding by those skilled in the art.

Note that the accompanying drawings and the following descriptions are presented to facilitate fully understanding of the present disclosure by those skilled in the art and, therefore, are not intended to impose any limitations on the subject matter described in the appended claims.

Any embodiment described hereinafter is to illustrate a specific example of the present disclosure. Features such as numerical values, constituent elements, arrangement positions and connection forms of the constituent elements, and operation timings to be described in the following embodiments are nothing more than examples of the embodiments, and are not intended to impose any limitations on the present disclosure. Moreover, of the constituent elements in the following embodiments, constituent elements not recited in the independent claim which defines the broadest concept will be described as optional constituent elements.

Furthermore, each of the drawings is a schematic view and is not necessarily depicted with high accuracy. Throughout the drawings, the same constituent elements are designated by the same numerals and symbols.

First Exemplary Embodiment

Hereinafter, a first embodiment will be described with reference to FIGS. 1 to 6.

[1-1. Configuration]

[1-1-1. Configuration of Lighting Device]

FIG. 1 is a schematic view of an example of a circuit configuration of lighting device 10 according to the first embodiment.

Lighting device 10 is a device to supply a constant electric current to solid-state light emitting device 20. Lighting device 10 includes DC/DC converter 30, drive circuit 40, and delay circuit 50.

Solid-state light emitting device 20 includes a plurality of solid-state light emitting elements which are coupled in parallel with each other. The plurality of the solid-state light emitting elements is four LED columns 20*a* to 20*d*, for example, with each column being configured with a plurality of LEDs which are coupled in series with each other. It is noted, however, that solid-state light emitting device 20 is not limited to this configuration.

Drive circuit 40 is a circuit to generate a feedback (FB) signal and a PWM signal. The FB signal indicates whether or not a voltage, which is required for a constant electric current to flow in solid-state light emitting device 20, is applied to solid-state light emitting device 20. The PWM signal indicates a current supply period during which the current flows in solid-state light emitting device 20. Drive circuit 40 includes driver 41, transistors 42*a* to 42*d*, and resistors 43*a* to 43*d*. Transistors 42*a* to 42*d* and resistors 43*a* to 43*d* are coupled in series with four LED columns 20*a* to 20*d*, respectively.

Driver 41 is coupled with a source terminal, a drain terminal, and a gate terminal of each of four transistors 42*a* to 42*d*. The driver is a circuit, which follows a dimming instruction from the outside, to perform control such that a constant current corresponding to the dimming instruction is supplied to each of four LED columns 20*a* to 20*d*. Driver 41 generates the feedback (FB) signal and the PWM signal corresponding to the dimming instruction. Note that, although FIG. 1 shows that driver 41 is coupled only with transistor 42*a*, driver 41 is also coupled with each of transistors 42*b* to 42*d* in the same manner.

Delay circuit 50 is a circuit to generate a delayed PWM signal by delaying at least one of the start timing and the end timing of the current supply period that is indicated by the PWM signal generated by drive circuit 40. In the present embodiment, delay circuit 50 generates the delayed PWM signal from the PWM signal fed from drive circuit 40 by delaying the start timing of the current supply period by a first delay amount, and by delaying the end timing of the current supply period by a second delay amount that is larger than the first delay amount, with the current supply period being indicated by the PWM signal.

DC/DC converter 30 is a circuit to generate a direct-current voltage, in accordance with the delayed PWM signal fed from delay circuit 50 and the FB signal fed from drive circuit 40, to be applied to solid-state light emitting device 20. This direct-current voltage is generated from another direct-current voltage fed from the outside. Note that, DC/DC converter 30 in the present embodiment is exemplified by a booster-type chopper circuit; however, DC/DC converter 30 is not limited to this configuration and may be another configuration.

DC/DC converter 30 includes control circuit 31, inductor 32, switching element 33, diode 34, and capacitor 35.

Control circuit 31 is a circuit to perform control such that switching element 33 is caused to switch in accordance with the FB signal fed from drive circuit 40, during the on-duty period that is determined by the delayed PWM signal fed from delay circuit 50, (that is, the control circuit supplies a switching signal for causing the switching element to perform the switching).

Switching element 33 is a negative-channel metal oxide semiconductor (NMOS) transistor, for example. However, switching element 33 is not limited to the NMOS transistor, and may be another semiconductor device operative to perform the switching operation.

Inductor 32 is a coil operative to allow a current to flow through the coil when switching element 33 is ON, and to release energy stored in the coil to solid-state light emitting device 20 via diode 34 when switching element 33 is OFF.

Capacitor 35 is a capacitor operative to smooth the output voltage (and the output current) of DC/DC converter 30.

[1-1-2. Configuration of Driver]

Figure 2:
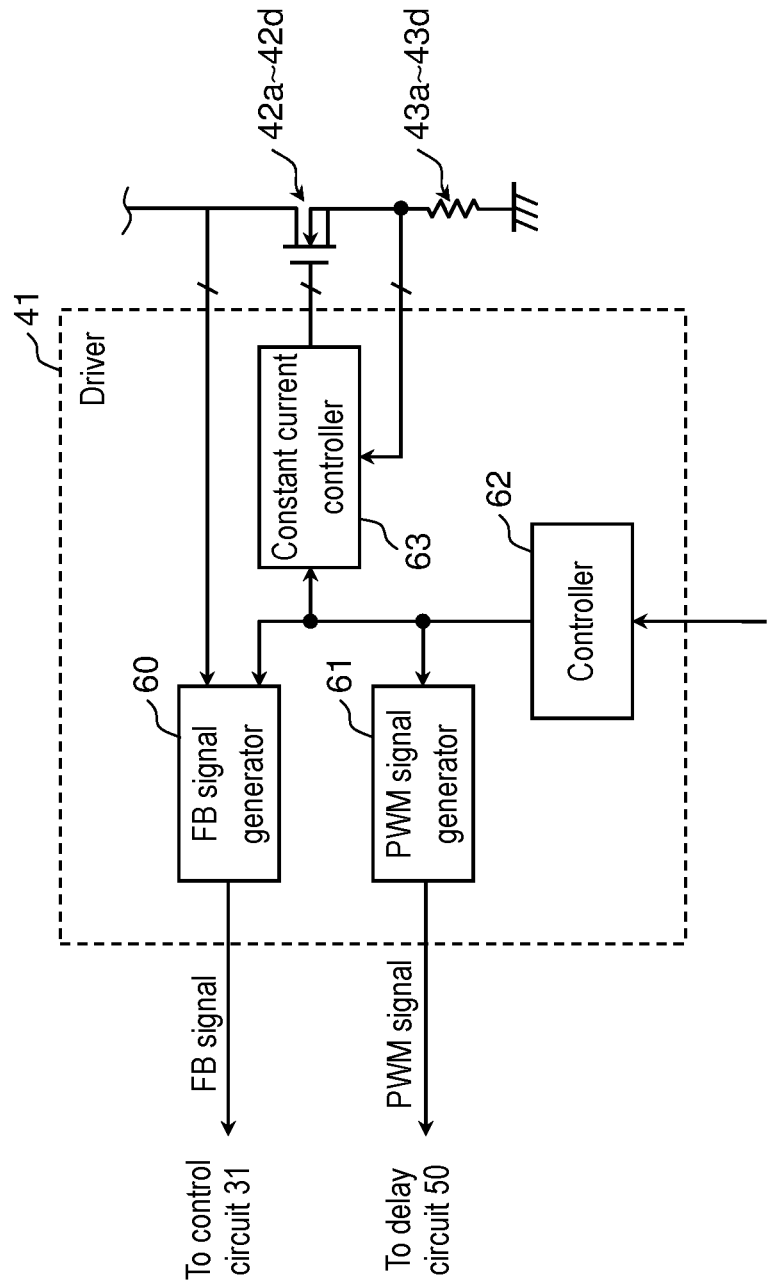
FIG. 2 is a schematic view of an example of a circuit configuration of a driver which is included in the lighting device according to the first embodiment.

FIG. 2 is a schematic view of an example of a circuit configuration of driver 41 which is included in lighting device 10 according to the first embodiment.

Driver 41 includes FB signal generator 60, PWM signal generator 61, controller 62, and constant current controller 63, as shown in FIG. 2.

Controller 62 is a circuit operative to control FB signal generator 60, PWM signal generator 61, and constant current controller 63, following the dimming instruction that is received from the outside.

FB signal generator 60 is a circuit operative to generate the FB signal based on a drain voltage of each of four transistors 42a to 42d, and to output the thus-generated signal to control circuit 31 of DC/DC converter 30. Although a diagram of its detailed configuration is omitted, FB signal generator 60 is configured with parts including: OR gates into which logic signals are inputted corresponding to the drain voltages of four transistors 42a to 42d, and transistors which are driven by output signals of the OR gates.

Specifically, FB signal generator 60 generates the FB signal in such a manner that the FB signal becomes in the open state (High) when the voltage required for the constant current to flow in solid-state light emitting device 20 is applied to solid-state light emitting device 20, and that the FB signal becomes equal to the ground potential (Low) when the voltage required for the constant current to flow in solid-state light emitting device 20 is not applied to solid-state light emitting device 20. In the present embodiment, solid-state light emitting device 20 is configured with four LED columns 20a to 20d which are coupled in parallel with each other. Then, FB signal generator 60 generates the signal such that the signal becomes in the open state (High) when a voltage required for a constant current to flow in every one of four LED columns 20a to 20d is applied the columns, and that the signal becomes equal to the ground potential (Low) when a voltage required for a constant current to flow in at least one of four LED columns 20a to 20d is not applied to the columns In accordance with the control by controller 62, PWM signal generator 61 generates a PWM signal (e.g., a PWM signal of 120 Hz) having the on-duty that corresponds to the dimming instruction inputted to controller 62, and then outputs the thus-generated PWM signal to delay circuit 50. Such a PWM signal generated here is a negative-true logic signal that becomes Low during the on-duty period and that becomes in the open state (High) during the other periods.

Constant current controller 63 is a circuit operative to control each of four transistors 42a to 42d such that the current (set current) is caused to flow in each of four LED columns 20a to 20d, during the on-duty period of the PWM signal generated by PWM signal generator 61. Here, the current (set current) is a target for the control by controller 62. Constant current controller 63 controls the gate voltage of each of four transistors 42a to 42d such that the set current is caused to flow in each of resistor 43a to 43d which are respectively coupled with the source terminals of four transistors 42a to 42d.

[1-1-3. Configuration of Delay Circuit]

Figure 3:
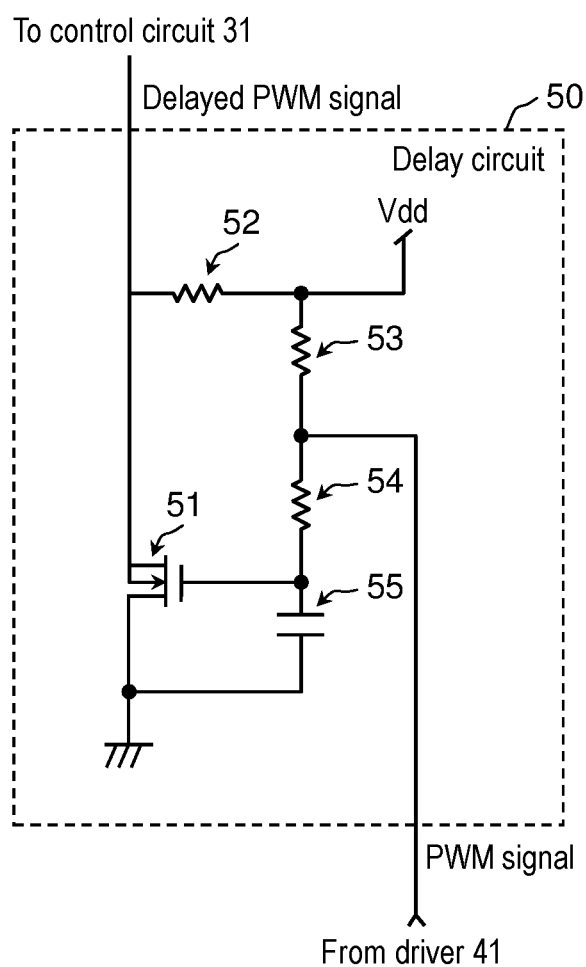
FIG. 3 is a schematic view of an example of a circuit configuration of a delay circuit which is included in the lighting device according to the first embodiment.

FIG. 3 is a schematic view of an example of a circuit configuration of delay circuit 50 which is included in lighting device 10 according to the first embodiment.

As shown in FIG. 30, delay circuit 50 includes: transistor 51 having one control terminal, one current input terminal, and one current output terminal; capacitor 55 at least one end of which is coupled with the control terminal of transistor 51; resistor 54 at least one end of which is coupled with the control terminal of transistor 51; and resistors 52 and 53.

Delay circuit 50 is coupled with drive circuit 40 such that the PWM signal generated by drive circuit 40 is supplied to the control terminal of transistor 51, via resistor 54. The current input terminal of transistor 51 is coupled with control circuit 31.

More specifically, in the present embodiment, transistor 51 is an NMOS transistor. Capacitor 55 is coupled between the gate terminal (control terminal) and the source terminal (current output terminal) of transistor 51. Resistor 52 is coupled between the drain terminal (current input terminal) of transistor 51 and power supply voltage Vdd. Two resistors 53 and 54 are coupled between power supply voltage Vdd and the gate terminal of transistor 51, with the two resistors being coupled in series with each other. The drain terminal of transistor 51 is coupled with control circuit 31. It is noted, however, that transistor 51 is not limited to the NMOS transistor.

In accordance with delay circuit 50, the negative-true logic PWM signal from driver 41 is inputted to the gate terminal of transistor 51 via resistor 54. Moreover, charges and discharges of capacitor 55 through resistors 53 and 54 cause logic-changes (changes from High to Low and from Low to High) to become gentle. The drain terminal of transistor 51 becomes in the open state, i.e. High, when the negative-true logic PWM signal inputted to the gate terminal is Low, and becomes substantially equal in potential to the source terminal, i.e. Low, when the negative-true logic PWM signal inputted to the gate terminal is High. As a result, the logic is inverted. Then, the PWM signal (delayed PWM signal) in which the timings of the logic-changes are delayed is output to control circuit 31.

Figure 4:
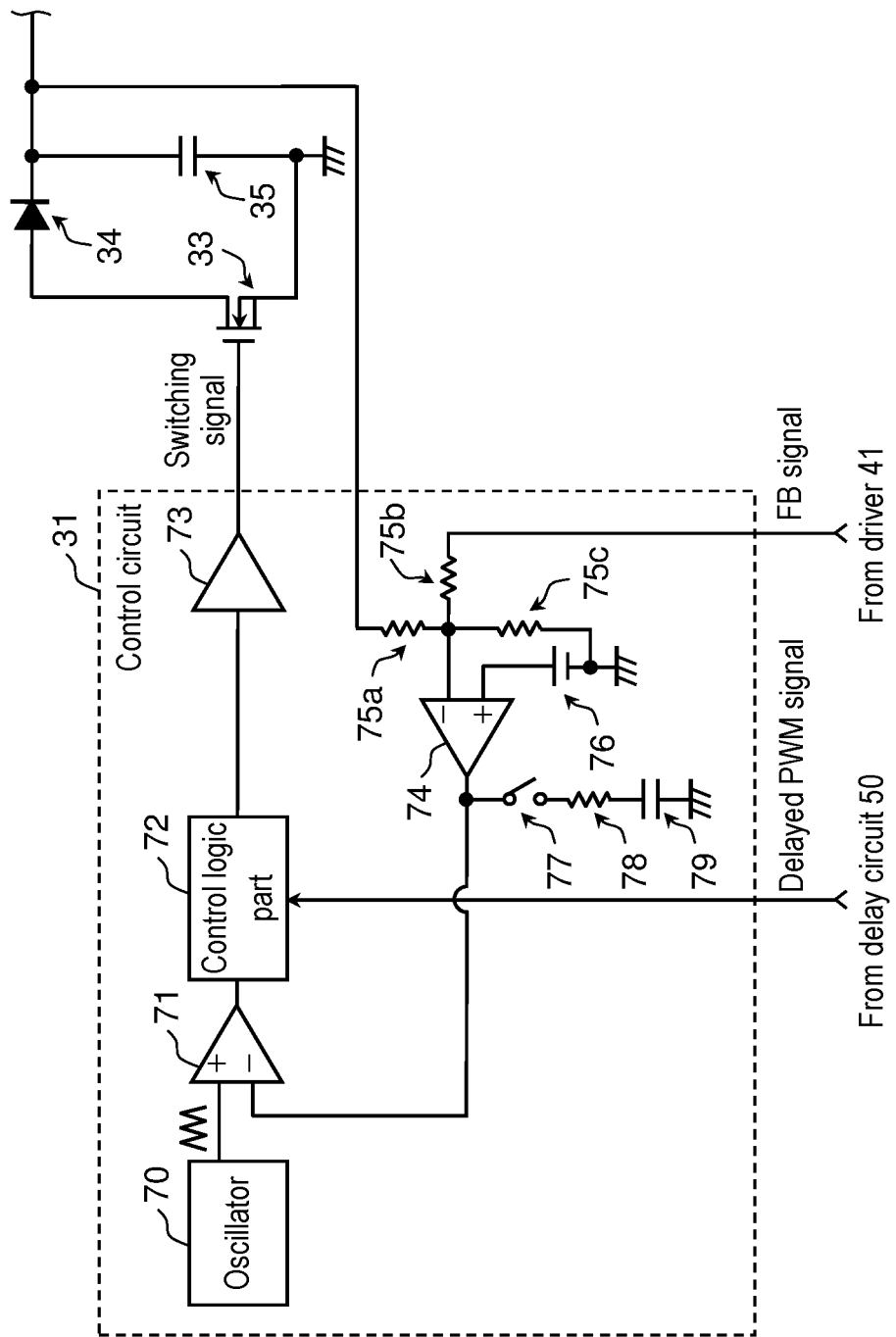
FIG. 4 is a schematic view of an example of a circuit configuration of a control circuit which is included in the lighting device according to the first embodiment.

FIG. 4 is a schematic view of an example of a circuit configuration of control circuit 31 which is included in lighting device 10 according to the first embodiment.

As shown in FIG. 4, control circuit 31 includes: oscillator 70, comparator 71, control logic part 72, buffer amplifier 73, error amplifier 74, resistors 75a to 75c, resistor 78, reference voltage source 76, capacitor 79, and switch 77.

Error amplifier 74 is inputted with signals as follows: The output voltage of DC/DC converter 30 (the applied voltage to solid-state light emitting device 20) is resistively divided with resistors 75a and 75c, and the resistively divided voltage is inputted to a negative input terminal of error amplifier 74. In addition, the FB signal fed from driver 41 is inputted to the negative input terminal of error amplifier 74 via resistor 75b. These two signals inputted to the negative input terminal are synthesized into a synthesized voltage. A difference is calculated, in error amplifier 74, between the synthesized voltage and the voltage inputted to a positive input terminal of the error amplifier, from reference voltage source 76. A difference signal which indicates the thus-calculated difference is inputted to a negative input terminal of comparator 71.

Switch 77 coupled with an output terminal of error amplifier 74 is a switching element (such as a transistor, for example) which operates in such a manner that the switch is in an open state when an inverted PWM signal fed from delay circuit 50 is Low, and that the switch is in a conduction state when the inverted PWM signal is High. The output terminal of error amplifier 74 is coupled with resistor 78 and capacitor 79 via switch 77, which causes the output state (differential signal) of error amplifier 74 to be held during the Low period of the inverted PWM signal.

Comparator 71 is inputted with signals as follows: A continuous triangular wave from oscillator 70 is inputted to a positive input terminal of the comparator, while the differential signal from error amplifier 74 is inputted to a negative input terminal of the comparator. Then, comparator 71 compares these two signals. A logic signal indicating the result of the comparison is generated and output to control logic part 72.

Control logic part 72 operates in such a manner that the logic signal inputted from comparator 71 is output to buffer amplifier 73 only during the on-duty period indicated by the delayed PWM signal fed from delay circuit 50. The logic signal inputted into buffer amplifier 73 is subjected to current amplification with buffer amplifier 73, and then supplied to switching element 33 as a switching signal to drive switching element 33.

Control circuit 31 thus-configured in this way performs the control such that the constant current is caused to flow in solid-state light emitting device 20, through use of both comparator 71 and error amplifier 74 which operates in accordance with the output voltage of DC/DC converter 30 and the FB signal. Moreover, control circuit 31 performs the control such that the current in accordance with the dimming instruction from the outside is caused to flow in solid-state light emitting device 20, through use of control logic part 72 which operates in accordance with the delayed PWM signal.

[1-2. Operation]

Next, descriptions will be made regarding operations of lighting device 10 configured as described above according to the present embodiment.

[1-2-1. Operation of Delay Circuit]

FIG. 5 is a timing chart illustrating an example of the operation of delay circuit 50 which is included in lighting device 10 according to the first embodiment.

The solid line in chart (a) of FIG. 5 indicates the PWM signal inputted to delay circuit 50, that is, the PWM signal output from driver 41. As shown in chart (a) of FIG. 5, the PWM signal is a negative logic signal that becomes Low during the on-duty period and becomes in the open state (High) during the other periods. Note that the dashed lines in charts (a) and (b) of FIG. 5 indicate threshold voltage Vgth of transistor 51 which configures delay circuit 50.

The solid line in chart (b) of FIG. 5 indicates a voltage (i.e., a gate signal) applied to the gate terminal of transistor 51. When the PWM signal changes from High to Low, electric charge having been stored in capacitor 55 is released via resistor 54, which causes the gate signal to vary gently from High to Low with a time constant that is determined by capacitor 55 and resistor 54. In contrast, when the PWM signal changes from Low to High, electric charge is stored in capacitor 55 via resistors 53 and 54, which causes the gate signal to vary gently from Low to High with a time constant that is determined by capacitor 55 and a combined resistor of resistors 53 and 54. Note that the time constant determined by capacitor 55 and the combined resistor of resistors 53 and 54 is larger than that determined by capacitor 55 and resistor 54. Therefore, as shown in chart (b) of FIG. 5, the gate signal varies much gentler when changing from Low to High than when changing from High to Low.

Chart (c) of FIG. 5 shows the delayed PWM signal (i.e., the voltage of the drain terminal of transistor 51) output from delay circuit 50. The delayed PWM signal changes from Low to High when the gate signal varies from a voltage higher than threshold voltage Vgth to a voltage lower than threshold voltage Vgth, and the delayed PWM signal changes from High to Low when the gate signal varies from a voltage lower than threshold voltage Vgth to a voltage higher than threshold voltage Vgth, as shown in chart (b) of FIG. 5.

With this operation, the PWM signal [shown in chart (a) of FIG. 5] inputted to delay circuit 50 is converted to the delayed PWM signal [shown in chart (c) of FIG. 5]. The thus-converted delayed PWM signal is such that the logic is inverted and that the start timing is delayed while the end timing is delayed greater than the start timing. Then, this delayed PWM signal is supplied to control circuit 31.

[1-2-2. Operation of DC/DC Converter]

FIG. 6 is a timing chart illustrating an example of an operation of DC/DC converter 30 which is included in lighting device 10 according to the first embodiment. FIG. 6 corresponds to FIG. 8A that shows the operation of the conventional lighting device. That is, FIG. 6 shows the operation in the case where a PWM signal with a very low on-duty of 0.2% is output from driver 41, as in the case of FIG. 8A.

In FIG. 6, (a) indicates the PWM signal which is output from driver 41 and inputted to delay circuit 50. Chart (b) of FIG. 6 indicates the delayed PWM signal which is output from delay circuit 50 and inputted to DC/DC converter 30. Chart (b) of FIG. 6 corresponds to chart (a) of FIG. 7A and to chart (a) of FIG. 8A. Charts (c) to (f) of FIG. 6 indicate the FB signal, the switching signal, voltage VLED, and current ILED, respectively. Moreover, charts (c) to (f) of FIG. 6 correspond to charts (b) to (e) of FIG. 7A and to charts (b) to (e) of FIG. 8A, respectively.

As shown in FIG. 6, the delayed PWM signal inputted to DC/DC converter 30 is the signal [see chart (b) of FIG. 6] that is converted, by delay circuit 50, from the PWM signal [see chart (a) of FIG. 6] output from driver 41. The converted signal is such that the logic is inverted and the timings are delayed. Accordingly, the FB signal is inputted to DC/DC converter 30 at timing earlier than the delayed PWM signal, without delay from the delayed PWM signal [see chart (c) of FIG. 6].

With this operation, the switching signal [the pulse signal shown in chart (d) of FIG. 6], which is generated during the on-duty period of the delayed PWM signal, is generated in the situation where the FB signal is being inputted to DC/DC converter 30. For this reason, the switching signal is generated to be a pulse signal having an appropriate on-duty period [see the first and second pulse signals shown in chart (d) of FIG. 6], without occurrence of the phenomenon where the on-duty is shortened due to the delay of the FB signal from the PWM signal, as described in FIG. 8A.

As a result, during this period (during which the first and second pulse signals of the switching signal are generated), voltage VLED applied to solid-state light emitting device 20 is maintained to be at the required voltage (dashed line) as shown in chart (e) of FIG. 6, while current ILED flowing in solid-state light emitting device 20 is maintained to be at the set current (dashed line) as shown in chart (f) of FIG. 6.

Moreover, the end timing of the delayed PWM signal is delayed relative to the end timing of the PWM signal [see chart (a) of FIG. 6] output from driver 41, and the delay time between their end timings is longer than the delay time between their start timings. For this reason, the delayed PWM signal is longer in on-duty period than the PWM signal output from driver 41 [see chart (b) of FIG. 6].

Therefore, during the period from the end of the on-duty of the PWM signal to the end of the on-duty of the delayed PWM signal, a switching signal (pulse signals) is(are) generated, although the on-duty of each of the pulse signals is shortened [see the third and fourth pulse signals shown in chart (d) of FIG. 6].

In the result, during this period (during which the third and fourth pulse signals of the switching signal are generated), the on-duty of the PWM signal has ended. Therefore, transistors 42a to 42d of drive circuit 40 become in the OFF state, which results in not flowing of current ILED in solid-state light emitting device 20 [see chart (d) of FIG. 6] and an increase in voltage VLED applied to solid-state light emitting device 20 [see chart (e) of FIG. 6].

These operations allow lighting device 10 according to the present embodiment to maintain the constant current operation even in the case where the on-duty of the PWM signal is set to be very low, e.g. 0.2%, which can provide dimming characteristics close to the ideal dimming characteristics shown in FIG. 7B.

[1-3. Effect. Etc.]

In this way, in accordance with lighting device 10 according to the present embodiment, the PWM signal output from drive circuit 40 is converted, by delay circuit 50, to the delayed PWM signal that is inputted to DC/DC converter 30, with the converted delayed PWM signal being delayed and having the longer on-duty period. Therefore, lighting device 10 is capable of maintaining the constant current operation even in the case where the PWM signal (delayed PWM signal) having a very low on-duty of e.g. 0.2% is inputted to DC/DC converter 30. That is, lighting device 10 according to the present embodiment can avoid the problem of conventional devices. The problem is such that the lowest gradation value is relatively large which is displayed in accordance with an on-duty capable of maintaining the constant current operation (the lowest gradation value is luminance displayed in accordance with the on-duty that is the minimum one larger than zero). Consequently, lighting device 10 can light solid-state light emitting device 20 at lower luminance than before.

4. Conclusion

As described above, the lighting device according to the present embodiment is a lighting device to supply a constant electric current to a solid-state light emitting device. The lighting device includes: a drive circuit; a delay circuit; and a DC/DC converter to generate, from a direct-current voltage, another direct-current voltage to be applied to the solid-state light emitting device. The drive circuit generates a feedback signal and a pulse width modulation (PWM) signal. The feedback signal indicates whether or not a voltage required for a constant current to flow in the solid-state light emitting device is applied to the solid-state light emitting device. The PWM signal indicates a current supply period during which a current is caused to flow in the solid-state light emitting device. The delay circuit delays at least one of the start timing and the end timing of the current supply period with respect to the PWM signal generated by the drive circuit. The DC/DC converter includes a switching element and a control circuit. The control circuit performs control such that the switching element is caused to switch in accordance with the feedback signal generated by the drive circuit, during an on-duty period that is determined by the PWM signal the timing of which is delayed by the delay circuit.

Note that lighting device 10 is an example of the lighting device. Solid-state light emitting device 20 is an example of the solid-state light emitting device. DC/DC converter 30 is an example of the DC/DC converter. Drive circuit 40 is an example of the drive circuit. Delay circuit 50 is an example of the delay circuit. Switching element 33 is an example of the switching element. Control circuit 31 is an example of the control circuit.

For example, in the example of configuration shown in the first embodiment, lighting device 10 is the lighting device to supply the constant electric current to solid-state light emitting device 20. The lighting device includes: drive circuit 40; delay circuit 50; and DC/DC converter 30 to generate, from a direct-current voltage, another direct-current voltage to be applied to solid-state light emitting device 20. Drive circuit 40 generates a feedback signal and a PWM signal. The feedback signal indicates whether or not a voltage required for a constant current to flow in solid-state light emitting device 20 is applied to solid-state light emitting device 20. The PWM signal indicates a current supply period during which a current is caused to flow in solid-state light emitting device 20. Delay circuit 50 delays at least one of the start timing and the end timing of the current supply period with respect to the PWM signal generated by drive circuit 40. DC/DC converter 30 includes switching element 33 and control circuit 31. Control circuit 31 performs control such that switching element 33 is caused to switch in accordance with the feedback signal generated by drive circuit 40, during an on-duty period that is determined by the PWM signal the timing of which is delayed by delay circuit 50.

With this configuration, the PWM signal output from drive circuit 40 is delayed by delay circuit 50, which can avoid the problem in which the on-duty of the first pulse of the switching signal is shortened. Therefore, lighting device 10 is capable of maintaining the constant current operation even in the case where the PWM signal (delayed PWM signal) having a very low on-duty of e.g. 0.2% is inputted to DC/DC converter 30. Consequently, lighting device 10 can light solid-state light emitting device 20 at lower luminance than before.

In the lighting device, the delay circuit may delay the start timing of the current supply period by a first delay amount, and may delay the end timing of the current supply period by a second delay amount that is larger than the first delay amount, with respect to the PWM signal generated by the drive circuit.

For example, in the example of configuration shown in the first embodiment, delay circuit 50 delays the start timing of the current supply period by a first delay amount, and delays the end timing of the current supply period by a second delay amount that is larger than the first delay amount, with respect to the PWM signal generated by drive circuit 40.

With this configuration, the PWM signal output from drive circuit 40 is converted, by delay circuit 50, to the delayed PWM signal having the longer on-duty period, which is then inputted to DC/DC converter 30. Therefore, lighting device 10 is capable of maintaining the constant current operation even in the case where the PWM signal (delayed PWM signal) having a very low on-duty of e.g. 0.2% is inputted to DC/DC converter 30. This allows lighting device 10 to light solid-state light emitting device 20 at lower luminance than before.

In the lighting device, the delay circuit may include: a transistor having one control terminal, one current input terminal, and one current output terminal; a capacitor at least one end of which is coupled with the control terminal of the transistor; a resistor at least one end of which is coupled with the control terminal of the transistor. And, the delay circuit may be configured to be coupled with the drive circuit such that the PWM signal generated by the drive circuit is supplied to the control terminal of the transistor via the resistor. The delay circuit may be a circuit that inverts a logic state of the PWM signal generated by the drive circuit.

Note that transistor 51 is an example of the transistor. Capacitor 55 is an example of the capacitor. Resistor 54 is an example of the resistor.

For example, in the example of configuration shown in the first embodiment, delay circuit 50 includes: transistor 51 having one control terminal, one current input terminal, and one current output terminal; capacitor 55 at least one end of which is coupled with the control terminal of transistor 51; resistor 54 at least one end of which is coupled with the control terminal of transistor 51. And, delay circuit 50 is configured to be coupled with drive circuit 40 such that the PWM signal generated by drive circuit 40 is supplied to the control terminal of transistor 51 via resistor 54. In addition, delay circuit 50 is a circuit that inverts a logic state of the PWM signal generated by drive circuit 40.

With this configuration, delay circuit 50 can be implemented by using such a simple circuit configuration using the transistor, the capacitor, and the resistor.

In the lighting device, the feedback signal may be a signal that becomes in an open state when a voltage required for a constant current to flow in the solid-state light emitting device is applied to the solid-state light emitting device, and that becomes equal to a ground potential when the voltage required for the constant current to flow in the solid-state light emitting device is not applied to the solid-state light emitting device.

For example, in the example of configuration shown in the first embodiment, the feedback signal is a signal that becomes in the open state (High) when a voltage required for a constant current to flow in solid-state light emitting device 20 is applied to solid-state light emitting device 20, and that becomes equal to the ground potential (Low) when the voltage required for the constant current to flow in solid-state light emitting device 20 is not applied to solid-state light emitting device 20.

This configuration allows lighting device 10 to adopt wired-OR connection for a plurality of the output terminals to output such feedback signals. Therefore, this brings about ease of implementation of the DC/DC converter that can operate in accordance with a plurality of the feedback signals which is output from a plurality of the drive circuits to drive the larger number of the solid-state light emitting elements.

In the lighting device, the solid-state light emitting device may include a plurality of solid-state light emitting elements which are coupled in parallel with each other. The feedback signal may be a signal that becomes in the open state when a voltage required for a constant current to flow in every one of the plurality of the solid-state light emitting elements is applied to the solid-state light emitting device, and that becomes equal to the ground potential when a voltage required for a constant current to flow in at least one of the plurality of the solid-state light emitting elements is not applied to the solid-state light emitting device.

Note that LED columns 20a to 20d are an example of the plurality of the solid-state light emitting elements which are coupled in parallel with each other.

For example, in the example of configuration shown in the first embodiment, solid-state light emitting device 20 includes a plurality of the solid-state light emitting elements (LED columns 20a to 20d) which are coupled in parallel with each other. The feedback signal is a signal that becomes in the open state (High) when a voltage required for a constant current to flow in every one of the plurality of the solid-state light emitting elements (LED columns 20a to 20d), which are coupled in parallel with each other, is applied to solid-state light emitting device 20, and that becomes equal to the ground potential (Low) when a voltage required for a constant current to flow in at least one of the plurality of the solid-state light emitting elements (LED columns 20a to 20d), which are coupled in parallel with each other, is not applied to solid-state light emitting device 20.

With this configuration, it is possible to implement the lighting device that is provided for a load with high luminance which is configured with a plurality of solid-state light emitting elements which are coupled in parallel with each other.

Other Exemplary Embodiments

As described above, the first embodiment has been described to exemplify the technology disclosed in the present application. However, the technology in the present disclosure is not limited to the embodiment, and is also applicable to embodiments that are subjected, as appropriate, to various changes and modifications, replacements, additions, omissions, and the like. Moreover, the technology disclosed herein also allows another embodiment which is configured by combining the appropriate constituent elements in the first embodiment described above.

Hence, other embodiments will be exemplified hereinafter.

In the first embodiment, the descriptions have been made using the example of configuration in which solid-state light emitting device 20 is the LEDs. However, solid-state light emitting device 20 is not limited to the LEDs and may be another solid-state light emitting device including an organic electro-luminescence (EL) device, for example.

Moreover, in the first embodiment, the descriptions have been made by using the exemplary configuration in which delay circuit 50 delays both the start timing and the end timing of the PWM signal; however, the present disclosure is not limited to the exemplary configuration. For example, delay circuit 50 may delay only one of these timings.

Furthermore, in the first embodiment, the descriptions have been made by using the exemplary configuration in which delay circuit 50 is configured including the transistor; however, the present disclosure is not limited to the exemplary configuration. Delay circuit 50 may be another circuit that includes: a simple circuit configured using a capacitor, a resistor, and the like; a circuit using an inductor; and a circuit using a timer IC, for example.

As described above, the exemplary embodiments have been described to exemplify the technology according to the present disclosure. To that end, the accompanying drawings and the detailed descriptions have been provided.

Therefore, the constituent elements described in the accompanying drawings and the detailed descriptions may include not only essential elements for solving the problems, but also inessential ones for solving the problems which are described only for the exemplification of the technology described above. For this reason, it should not be acknowledged that these inessential elements are considered to be essential only on the grounds that these inessential elements are described in the accompanying drawings and/or the detailed descriptions.

Moreover, because the aforementioned embodiments are used only for the exemplification of the technology disclosed herein, it is to be understood that various changes and modifications, replacements, additions, omissions, and the like may be made to the present embodiments without departing from the scope of the appended claims or the scope of their equivalents.

INDUSTRIAL APPLICABILITY

The technology according to the present disclosure is applicable to lighting devices that supply constant electric currents to solid-state light emitting devices. Specifically, it is applicable to a backlight of a liquid crystal display device, a lighting apparatus provided with a dimming function, and the like.

REFERENCE MARKS IN THE DRAWINGS 10 lighting device
20 solid-state light emitting device
20a, 20b, 20c, 20d LED column
30 DC/DC converter
31 control circuit
32 inductor
33 switching element
34 diode
35, 55, 79 capacitor
40 drive circuit
41 driver
42a, 42b, 42c, 42d, 51 transistor
43a, 43b, 43c, 43d, 52, 53, 54, 75a, 75b, 75c, 78 resistor
50 delay circuit
60 FB signal generator
61 PWM signal generator
62 controller
63 constant current controller
70 oscillator
71 comparator
72 control logic part
73 buffer amplifier
74 error amplifier
76 reference voltage source
77 switch

The invention claimed is:

1. A lighting device for supplying a constant current to a solid-state light emitting device, the lighting device comprising:
   a DC/DC converter for generating, from a direct-current voltage, another direct-current voltage to be applied to the solid-state light emitting device;
   a drive circuit for generating a feedback signal and a pulse width modulation (PWM) signal, the feedback signal indicating whether a voltage required for the constant current to flow in the solid-state light emitting device is applied to the solid-state light emitting device or not, the PWM signal indicating a current supply period during which a current flows in the solid-state light emitting device; and
   a delay circuit for delaying at least one of a start timing and an end timing of the current supply period with respect to the PWM signal generated by the drive circuit,
   wherein the DC/DC converter includes:
      a switching element; and
      a control circuit for performing control such that the switching element is caused to switch in accordance with the feedback signal generated by the drive circuit, during an on-duty period determined by the PWM signal the timing of which has been delayed by the delay circuit.

2. The lighting device according to claim 1, wherein the delay circuit delays the start timing of the current supply period by a first delay amount, and delays the end timing of the current supply period by a second delay amount larger than the first delay amount, with respect to the PWM signal generated by the drive circuit.

3. The lighting device according to claim 1,
   wherein the delay circuit includes:
      a transistor having one control terminal, one current input terminal, and one current output terminal;
      a capacitor at least one end of which is coupled with the control terminal of the transistor; and
      a resistor at least one end of which is coupled with the control terminal of the transistor, and
   the delay circuit is coupled with the drive circuit such that the PWM signal generated by the drive circuit is supplied to the control terminal of the transistor via the resistor.

4. The lighting device according to claim 1, wherein the delay circuit is a circuit that inverts a logical state of the PWM signal generated by the drive circuit.

5. The lighting device according to claim 1, wherein the feedback signal is a signal that becomes in an open state when a voltage required for a constant current to flow in the solid-state light emitting device is applied to the solid-state light emitting device, and that becomes equal to a ground potential when the voltage required for the constant current to flow in the solid-state light emitting device is not applied to the solid-state light emitting device.

6. The lighting device according to claim 5,
   wherein the solid-state light emitting device includes a plurality of solid-state light emitting elements coupled in parallel with each other, and
   wherein the feedback signal is a signal that becomes in the open state when a voltage required for a constant current to flow in every one of the plurality of the solid-state light emitting elements is applied to the solid-state light emitting device, and that becomes equal to the ground potential when a voltage required for a constant current to flow in at least one of the plurality of the solid-state light emitting elements is not applied to the solid-state light emitting device.

7. The lighting device according to claim 1, wherein the drive circuit receives a dimming instruction signal as an input signal.

* * * * *